United States Patent [19]

Shah

[11] Patent Number: 4,472,456
[45] Date of Patent: Sep. 18, 1984

[54] ABSORPTION OPTIMIZED LASER ANNEALING

[75] Inventor: Rajiv R. Shah, Plano, Tex.

[73] Assignee: Texas Instruments Incorporated, Dallas, Tex.

[21] Appl. No.: 442,825

[22] Filed: Nov. 18, 1982

[51] Int. Cl.$^3$ .............................................. B05D 3/06
[52] U.S. Cl. ............................ 427/53.1; 219/121 LE; 219/121 LF
[58] Field of Search ................ 427/53.1; 219/121 LE, 219/121 LF

[56] References Cited

U.S. PATENT DOCUMENTS

| | | | |
|---|---|---|---|
| 4,097,889 | 6/1978 | Kern et al. | 427/94 |
| 4,249,960 | 2/1981 | Schnable et al. | 427/53.1 |
| 4,258,078 | 3/1981 | Celler et al. | 427/53.1 |
| 4,284,659 | 8/1981 | Jaccodine et al. | 427/53.1 |

OTHER PUBLICATIONS

M. Delfino et al., "Laser Activated Flow of Phosphosilicate Glass in Integrated Circuit Devices", IEEE Electron Device Letters, vol. EDL3, No. 5, May 1982, pp. 116–118.

P. Jeuch et al., "P-Glass Reflow with a Tunable $CO_2$ Laser", Article in Laser and Electron–Beam Interaction with Solids, ed. by B. R. Appleton et al., Elseview Science Pub. Co., Inc. 1982, pp. 603–608, Also presented at the Materials Research Society Meeting, Boston, MA, Nov. 16–21, 1981.

Primary Examiner—John H. Newsome
Attorney, Agent, or Firm—Douglas A. Lashmit; N. Rhys Merrett; Melvin Sharp

[57] ABSTRACT

A method for selectively heating an insulating layer on a semiconductor structure by a high energy transient radiation source to a temperature sufficient to cause reflow without any significant heating of the regions adjacent to or underlying the insulating layer. In one embodiment a laser tuned to the absorption wavelength of the insulating material is scanned over the surface of the semiconductor structure. In another embodiment an insulating layer and an underlying or adjacent semiconductor layer are concurrently heated by a laser tuned to an absorption wavelength common to both in order to maintain the integrity of the interface therebetween. In a further embodiment the depth of heating in an insulating layer is controlled by selecting an appropriate dwell time for a continuous wave laser and a pulse duration for a pulsed laser.

16 Claims, 4 Drawing Figures

ABSORPTION OPTIMIZED LASER ANNEALING

BACKGROUND OF THE INVENTION

This invention relates generally to the formation of insulating layers during the fabrication of semiconductor integrated circuit devices, and more particularly to a method for reflowing such layers to form a smooth surface topography.

Bipolar and metal-oxide-semiconductor (MOS) devices frequently include phosphosilicate glass (PSG), silicon dioxide, or silicon nitride layers for insulation and passivation. These layers are typically thermally grown or deposited on silicon, polysilicon, or metal. During subsequent processing steps these insulating layers are patterned and etched using either plasma, reactive ion, or wet etching techniques. Such etchants, particularly plasma and reactive etches, usually produce vertical sidewalls, sharp edges and sharp corners in the etched layers, which tend to create step coverage problems during the formation of overlying layers. One known method for removing the sharp features in PSG is to subject the device to a high temperature in order to reflow the PSG. However, this process is satisfactory only for fairly high concentrations of phosphorus, i.e., 10-12 percent, in PSG. For lower concentrations, temperatures in excess of about 1,000 degrees C. are required to achieve reflow. In the case of very low concentrations of phosphorus, and for undoped oxide and nitride, this technique is unsatisfactory.

High temperature reflow can also not be utilized when the insulating layer overlies a layer of low melting point metal, for example, aluminum or an aluminum-copper alloy. Even high melting point metal layers usually suffer degradation during high temperature processing. Such heat treatment steps normally last 30-60 minutes, which is long enough to cause substantial diffusion of implanted or diffused impurities in silicon and polysilicon. This diffusion is particularly undesirable in very large scale integrated circuit devices.

If the device is heated for a shorter period of time, higher temperatures are needed to cause reflow and the time-temperature product still remains unacceptably high. Further, even where a high temperature step is acceptable for reflowing a PSG layer, the concentration of phosphorus required in the PSG is so high that the phosphorus will eventually react with moisture in the air to form phosphoric acid which corrodes the metallization in the circuit and frequently causes device failure.

In addition to the need for reflowing edges and corners, heating or annealing of oxide and nitride layers is advantageous for reparing damage caused during implantation and for improving the structural integrity of oxides grown on polysilicon, i.e., interlevel oxides (ILO). One technique for improving the ILO is to laser anneal the polysilicon prior to oxide growth. The undesirable heating of the underlying layer is still a problem, however.

There is thus a need for a method for heating the insulating layer to be reflowed while maintaining the other regions of the device at a relatively low temperature.

SUMMARY OF THE INVENTION

The present invention provides a method for selectively heating an insulating layer on a semiconductor structure by a high energy transient radiation source to a temperature sufficient to cause reflow without any significant heating of the regions adjacent to or underlying the insulating layer.

One aspect of the invention is embodied in a method wherein a continuous wave or a pulsed laser tuned to the absorption wavelength of the insulating material is scanned over the surface of the semiconductor structure. Only the insulating layer will absorb any significant amount of laser energy.

Another aspect of the invention is embodied in a method for concurrently heating an insulating layer and an underlying or an adjacent semiconductor layer by a laser tuned to an absorption wavelength common to both materials in order to maintain the integrity of the interface therebetween.

Still another aspect of the invention is embodied in a method for controlling the depth of heating in an insulating layer by selecting an appropriate dwell time for a continuous wave laser or an appropriate pulse duration for a pulsed laser.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawings, wherein:

DETAILED DESCRIPTION OF THE INVENTION

It has been determined that insulating materials such as PSG, silicon dioxide and silicon nitride formed on a semiconductor structure can be selectively heated by a high energy transient radiation source to a temperature sufficient to cause reflow without any significant heating of the regions underlying or adjacent to the insulating material.

Figure 1:
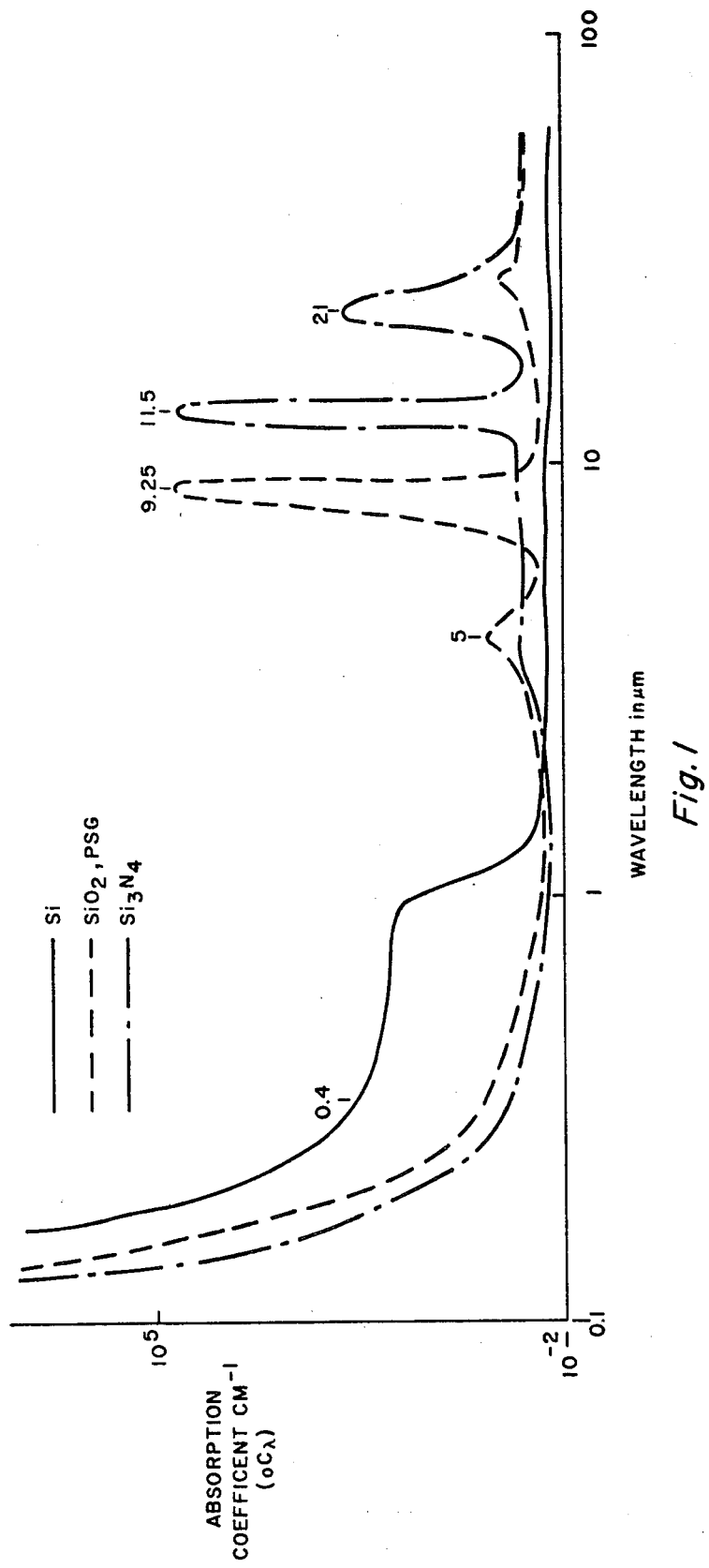
FIG. 1 is a graphical representation of the energy absorption coefficient as a function of wavelength for various materials.

In one embodiment of the present invention a continuous wave (CW) or a pulsed laser is tuned to a wavelength that is within a strong absorption band of the insulating material to be heated. The laser beam is then scanned over the surface of a semiconductor wafer by any known method for a length of time and in such a manner as to cause the insulating material to reflow. Referring to FIG. 1, which is a graphical representation of the absorption coefficient as a function of wavelength, it can be seen that for PSG and silicon dioxide a strong absorption band occurs at wavelengths of about 5 microns and about 9-11 microns, with a peak occurring at about 9.25 microns. A CO or a $CO_2$ laser tuned to this wavelength was found to be particularly useful in reflowing PSG and silicon dioxide without significantly heating the underlying polysilicon or silicon. Similarly, silicon nitride exhibits a high absorption coefficient for radiation at wavelengths of about 11.5 microns and about 21 microns. The laser is therefore tuned to this wavelength for nitride reflow.

In another embodiment of the present invention, when it is desired to heat both an insulating region and an adjacent or an underlying silicon or polysilicon region, a laser having an emission absorbed by both types of materials is employed. In the case of silicon and silicon dioxide, referring again to FIG. 1, the absorption coefficient of both materials is high for wavelengths less than about 400 nm. For example, an excimer or other ultraviolet laser having a wavelength less than about 400 nm. will reflow silicon dioxide and heat the adjacent or underlying silicon or polysilicon regions without causing any damage in the silicon or at the silicon to silicon dioxide interface.

Figure 2:
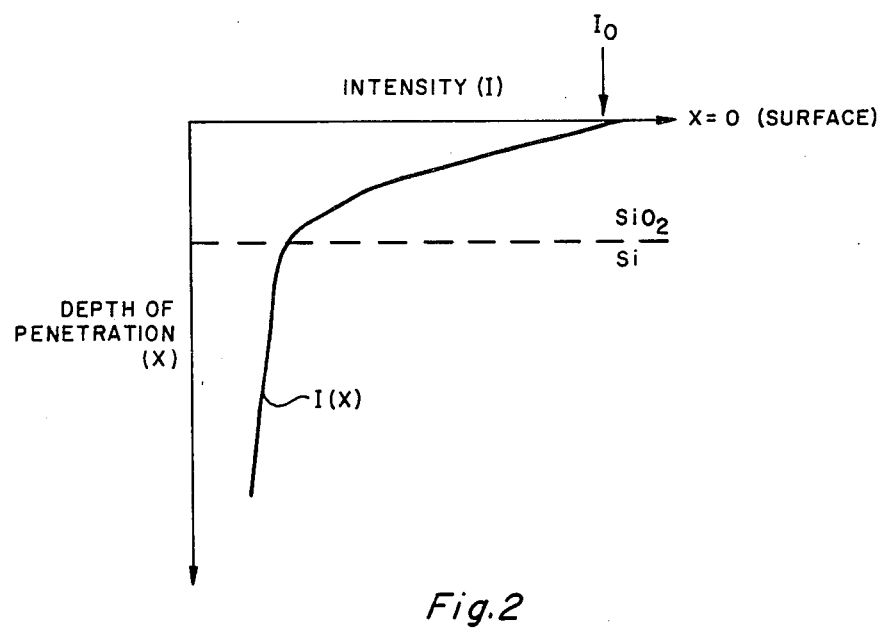
FIG. 2 is a graphical representation of energy intensity as a function of depth of penetration into a material.

Another aspect of the present invention is embodied in a method for controlling the depth of heating in a layer heated as described above. The penetration of laser energy into a particular material, that is, the energy intensity at a given distance from the incident surface of the material, may be expressed as $$I(x) = I_o e^{-\alpha_\lambda x}$$

where
$I_o$ = energy intensity at the surface
$\alpha_\lambda$ = absorption coefficient
$x$ = penetration depth with respect to the incident surface It is apparent from the above equation that the effective depth of penetration of laser energy into a material for a given $I_o$ is approximately $(1/\alpha_\lambda)$. A typical energy intensity profile as a function of penetration distance is shown in FIG. 2. The depth of heating is further determined by the dwell time in the case of a CW laser and the pulse duration in the case of a pulsed laser.

The dwell time, $t_d$, of a CW laser is approximately equal to $(d/v)$, where d is the beam diameter and v is the scanning viscosity. A shorter dwell time will thus result in a reduced depth of heating for a given CW power at a particular wavelength.

Figure 3:
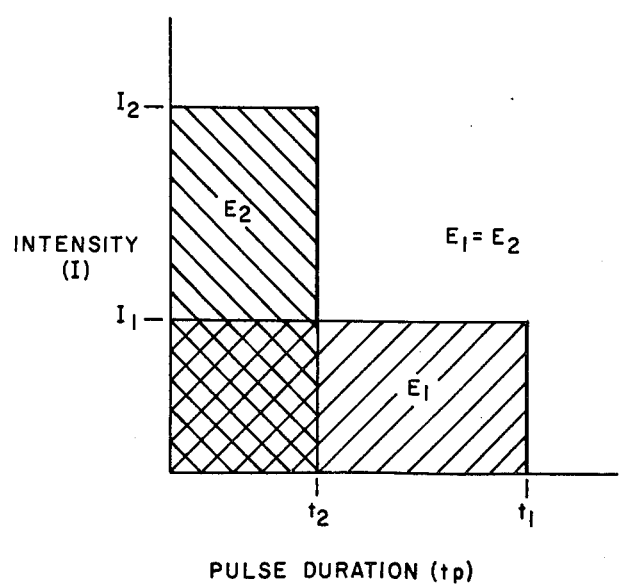
FIG. 3 is a graphical representation of the intensity level of pulses of different durations for a given pulse energy.
Figure 4:
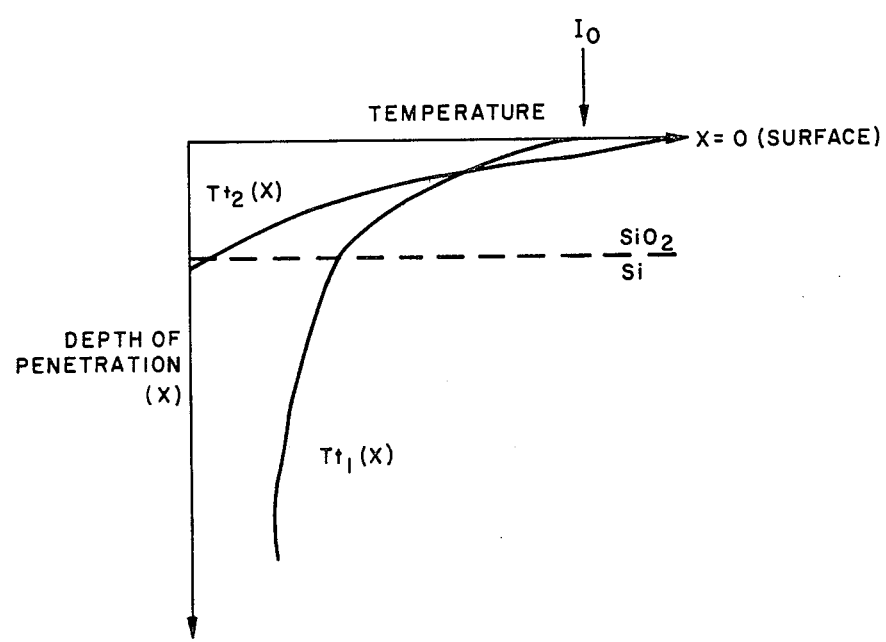
FIG. 4 is a graphical representation of the depth of heating profiles for pulses of different durations.

In the case of a pulsed laser at a given wavelength and pulse energy, a shorter pulse duration results in a higher pulse intensity and a shallower depth of heating. This is apparent by referring to the following expression for pulse energy, E, where $t_p$ is the pulse duration $$E = \int_0^{t_p} I(t) dt$$

and to FIG. 3, which shows the effect on intensity I of shortening the pulse duration from $t_1$ to $t_2$ while the pulse energy E, or the area under the intensity curves, remains constant. FIG. 4 shows the depth of heating, which is related to the radiation intensity profiles, for pulses of durations $t_1$ and $t_2$, where $t_2$ is less than $t_1$.

It has also been determined that the lateral temperature profile and the associated stresses in a layer of material can be controlled by selecting an appropriate spatial profile for the laser beam. For example, a rectangular, a triangular, or any profile other than the normal Gaussian profile may effectively be employed depending on the desired temperature and stress profiles.

The foregoing embodiments may be effected by a CW laser having a power of about 20-150 watts. A spot size ranging from about 50 microns to about 500 microns will result in a power density of about 75-150 kW/cm$^2$ and, assuming a scan velocity of 0.5-50 cm/sec., the dwell time will range from 0.1-10 msec.

When a pulsed laser is employed, a satisfactory intensity and temperature profile can be obtained with a pulse duration of about 10 microseconds. At a pulse repetition rate of 1-100 pulses per second and a pulse energy of about 0.1-5 J/cm$^2$, the resulting energy intensity is about 75-150 kW/cm$^2$. A pulse duration of about 10 nanoseconds at a similar energy level and a pulse repetition rate of $10^3$-$10^4$ pps. will result in an energy intensity of 75-150 MW/cm$^2$.

The present invention thus provides a method for selectively heating and reflowing an insulating layer in an integrated circuit device without heating an underlying or an adjacent semiconductor layer. A method is also provided for simultaneously heating an insulating layer and an underlying semiconductor layer to maintain the integrity of the interface therebetween during reflow of the insulating layer.

Obviously, many modifications and variations of this invention are possible in the light of the above teachings. It is therefore to be understood that within the scope of the appended claims the invention may be practiced otherwise than as specifically described.

What is claimed is:

1. A method for selectively heating an insulating layer on a semiconductor device comprising the steps of:
   exposing the insulating layer to a continuous wave, scanned high energy laser beam, the wavelength of which is adjusted to coincide with a high absorption wavelength of said insulating layer; and
   selecting the dwell time of said laser beam so that the temperature rise in said insulating layer from said laser beam is substantially reduced as the distance from the surface of said insulating layer increases.

2. The method of claim 1 wherein said insulating layer comprises phosphosilicate glass.

3. The method of claim 1 wherein said insulating layer comprises silicon dioxide.

4. The method of claim 1 wherein said insulating layer comprises silicon nitride.

5. A method for selectively heating an insulating layer on a semiconductor device comprising the steps of:
   exposing the insulating layer to a pulsed, scanned high energy laser beam, the wavelength of which is adjusted to coincide with a high absorption wavelength of said insulating layer; and
   selecting the pulse duration and rate of said laser beam so that the temperature rise in said insulating layer from said laser beam is substantially reduced as the distance from the surface of said insulating layer increases.

6. The method of claim 5 wherein said insulating layer comprises phosphosilicate glass.

7. The method of claim 5 wherein said insulating layer comprises silicon dioxide.

8. The method of claim 5 wherein said insulating layer comprises silicon nitride.

9. A method for fabricating a semiconductor device comprising the steps of:
   forming an insulating layer on a semiconductor region;
   exposing said insulating layer to high energy laser radiation which is coupled to said insulating layer and said underlying semiconductor layer to reflow said insulating layer while heating said semiconductor layer to maintain the integrity of the interface therebetween.

10. The method of claim 9 wherein said exposing step comprises the steps of:
   adjusting the wavelength of said laser radiation to coincide with a high absorption wavelength of both said insulating layer and said semiconductor region; and
   continuously scanning a laser beam over the surface of said insulating layer.

11. The method of claim 10 wherein the scanning step is accomplished with a beam from a continuous wave laser.

12. The method of claim 11 wherein said insulating layer comprises phosphosilicate glass and said semiconductor region comprises silicon.

13. The method of claim 11 wherein said insulating layer comprises silicon dioxide and said semiconductor region comprises silicon.

14. The method of claim 10 wherein the scanning step is accomplished with a beam from a pulsed laser.

15. The method of claim 14 wherein said insulating layer comprises phosphosilicate glass and said semiconductor region comprises silicon.

16. The method of claim 14 wherein said insulating layer comprises silicon dioxide and said semiconductor region comprises silicon.

* * * * *